United States Patent
Chiang

(10) Patent No.: US 11,611,277 B2
(45) Date of Patent: Mar. 21, 2023

(54) SOFT-START METHOD FOR A SWITCHING REGULATOR

(71) Applicant: Audiowise Technology Inc., Hsinchu (TW)

(72) Inventor: Kuei-Ju Chiang, Hsinchu (TW)

(73) Assignee: AIROHA TECHNOLOGY CORP., Hsinchu (TW)

( * ) Notice: Subject to any disclaimer, the term of this patent is extended or adjusted under 35 U.S.C. 154(b) by 205 days.

(21) Appl. No.: 17/037,921

(22) Filed: Sep. 30, 2020

(65) Prior Publication Data

US 2022/0103069 A1 Mar. 31, 2022

(51) Int. Cl.
| | |
|---|---|
| H02M 3/158 | (2006.01) |
| H02M 1/32 | (2007.01) |
| G01R 19/165 | (2006.01) |
| H02H 9/00 | (2006.01) |
| H02M 1/36 | (2007.01) |
| H02M 1/00 | (2006.01) |

(52) U.S. Cl.
CPC ...... *H02M 3/158* (2013.01); *G01R 19/16538* (2013.01); *H02H 9/001* (2013.01); *H02M 1/32* (2013.01); *H02M 1/36* (2013.01); *H02M 1/0009* (2021.05)

(58) Field of Classification Search
CPC ........ H02M 1/32; H02M 1/36; H02M 1/0009; H02M 3/158; H02M 3/155; H02M 3/156; H02M 3/1566; H02M 3/157; H02M 3/1582; H02H 9/001
See application file for complete search history.

(56) References Cited

U.S. PATENT DOCUMENTS

| | | | | |
|---|---|---|---|---|
| 10,180,695 | B1 * | 1/2019 | Bikulcius | ................ G05F 1/468 |
| 2005/0275388 | A1 * | 12/2005 | Takimoto | ................ H02M 1/32 |
| | | | | 323/272 |
| 2015/0256060 | A1 * | 9/2015 | Faingersh | ............... H02M 1/36 |
| | | | | 323/267 |

* cited by examiner

*Primary Examiner* — Nguyen Tran
(74) *Attorney, Agent, or Firm* — McClure, Qualey & Rodack, LLP

(57) ABSTRACT

A soft-start method for a switching regulator is provided. In the soft-start method, a first gate drive signal for limiting an inrush current is provided, by a control circuit, to a switching circuit in a first soft-start stage. After the control circuit determines that a mode switching condition is satisfied according to an output voltage and an output current, a second drive signal for increasing a rise rate of an output voltage is provided to the switching circuit so that the output voltage increases with a faster rise rate and reaches a predetermined voltage at a second soft-start stage.

15 Claims, 3 Drawing Sheets

SOFT-START METHOD FOR A SWITCHING REGULATOR

FIELD OF THE DISCLOSURE

The present disclosure relates to a soft-start method for a switching regulator, and more particularly to a two-stage soft-start method for a switching regulator.

BACKGROUND OF THE DISCLOSURE

A switching power regulator is widely used to perform DC-to-DC or AC-to-DC voltage conversion so as to convert an initial input voltage to a required voltage for at least one load device that is coupled thereto. The switching power regulator usually includes a control unit and two or more power transistors that are connected to the control unit to perform the aforementioned functions. However, during startup of the switching power regulator, an inrush current may be generated such that the load device may be damaged.

Conventionally, in order to limit the inrush current to thereby protect the load device from being destroyed during startup of the switching power regulator, the switching power regulator may operate under either a PFM (pulse frequency modulation) mode during its startup so that an output voltage can be gradually ramped up to a predetermined voltage by the switching power regulator. However, if the switching power regulator operates only under the PFM mode to limit the inrush current during its startup, a longer period of rise time will be required for the output voltage to reach the predetermined voltage.

Accordingly, the switching power regulator may operate under another mode, i.e., a PWM (pulse width modulation) mode, during its startup to reduce the required rise time. However, if the switching power regulator operates only under the PWM mode during its startup, it will be harder to limit the inrush current to be within a tolerance range during startup of the switching power regulator.

SUMMARY OF THE DISCLOSURE

In response to the above-referenced technical inadequacies, the present disclosure provides a soft-start method for a switching regulator so that an inrush current can be limited to being within a tolerance range during startup of the switching regulator and an output voltage can be increased to a predetermined voltage within a relatively shorter rise time.

In one aspect, the present disclosure provides a soft-start method for a switching regulator including the steps of: providing a first gate drive signal having a plurality of first on-off cycles to a switching circuit, by a control circuit, so as to generate an output voltage and an output current; detecting the output voltage by a voltage feedback circuit and the output current by a current feedback circuit; determining whether a mode switching condition is satisfied or not according to the output voltage and the output current that are transmitted to the control circuit; and when the mode switching condition is satisfied, providing a second gate drive signal having a plurality of second on-off cycles to the switching circuit, by the control circuit, so that the output voltage is increased to a predetermined voltage.

In certain embodiments, when the mode switching condition is not satisfied, the control circuit still provides the first gate drive signal to the switching circuit.

In certain embodiments, the first gate drive signal is a pulse skip modulation (PSM) signal, and the second gate drive signal is a pulse width modulation (PWM) signal.

In certain embodiments, the soft-start method further includes a step of providing an input voltage to the switching circuit by a power supply. The first gate drive signal has a switched-on period in each first on-off cycle. The input voltage, the output voltage, and the switched-on period satisfy the following relationship: $(V_{in}/L) \times t_{on} < N$, in which L represents a predetermined inductance value, $V_{in}$ represents the input voltage, $t_{on}$ represents the switched-on period, and N represents an adjustable value that ranges from 10 μA to 150 μA.

In certain embodiments, a ratio of a second period of each second on-off cycle to a first period of each first on-off cycle ranges from 0.01 to 3.

In certain embodiments, the output current has a plurality of ramp up/down cycles, and the mode switching condition includes the output voltage being greater than or equal to a threshold voltage, and a duration of each ramp up/down cycle being less than a second period of each second on-off cycle.

In certain embodiments, the switching regulator is a buck switching regulator or a boost switching regulator.

In certain embodiments, the soft-start method further includes a step of calculating a parameter value by dividing the output voltage by a predetermined inductance value. Furthermore, the output current has a plurality of ramp up/down cycles, and the mode switching condition includes the parameter value being greater than or equal to a threshold value, and a duration of one of the ramp up/down cycles being less than a second period of each second on-off cycle.

In certain embodiments, the first gate drive signal is provided at a starting time, the second gate drive signal is provided at a switching time, the output voltage gradually increases with time in a time period from the starting time to the switching time, and the output voltage sharply increases with time after the switching time until the output voltage reaches the predetermined voltage.

In another aspect, the present disclosure provides a soft-start method for a switching regulator including the steps of: providing a pulse skip modulation (PSM) signal having a plurality of first on-off cycles to a switching circuit at a first soft-start stage, by a control circuit, so as to generate an output voltage and an output current; determining whether a switching mode condition is satisfied or not according to the output voltage and the output current; and when the switching mode condition is satisfied, providing a pulse width modulation (PWM) signal having a plurality of second on-off cycles to the switching circuit at a second soft-start stage so that the output voltage is increased to a predetermined voltage, in which the first soft-start stage is prior to the second soft-start stage.

In certain embodiments, the output current has a plurality of ramp up/down cycles, and the switching mode condition includes the output voltage being greater than or equal to a threshold voltage, and a duration of each ramp up/down cycle being less than a period of each second on-off cycle.

In certain embodiments, the soft-start method further includes a step of calculating a parameter value by dividing the output voltage by a predetermined inductance value, and the mode switching condition includes the parameter value being greater than or equal to a threshold value, and a duration of each ramp up/down cycle being less than a period of each second on-off cycle.

In certain embodiments, the output voltage gradually increases with time at the first soft-start stage, and then sharply increases with time at the second soft-start stage until the output voltage reaches the predetermined voltage.

In certain embodiments, the soft-start method further includes a step of providing an input voltage to the switching circuit by the control circuit, in which the PSM signal has a switched-on period in each first on-off cycle, and the input voltage, the output voltage, and the switched-on period satisfy the following relationship: $(V_{in}/L) \times t_{on} < N$, in which L represents a predetermined inductance value, $V_{in}$ represents the input voltage, $t_{on}$ represents the switched-on period, and N represents an adjustable value and ranges from 10 µA to 150 µA.

In certain embodiments, a ratio of a first period of each first on-off cycle to a second period of each second on-off cycle period ranges from 0.01 to 3.

Therefore, one of the advantages of the present disclosure is that in a soft-start method for a switching regulator, by providing the first gate drive signal having a plurality of first on-off cycles to the switching circuit at the first soft-start stage and providing the second gate drive signal having a plurality of second on-off cycles to the switching circuit at the second soft-start stage, the output current can be limited to being within a tolerance range during startup of the switching regulator. In addition, the output voltage can be ramped up to a predetermined voltage within a relatively shorter rise time.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
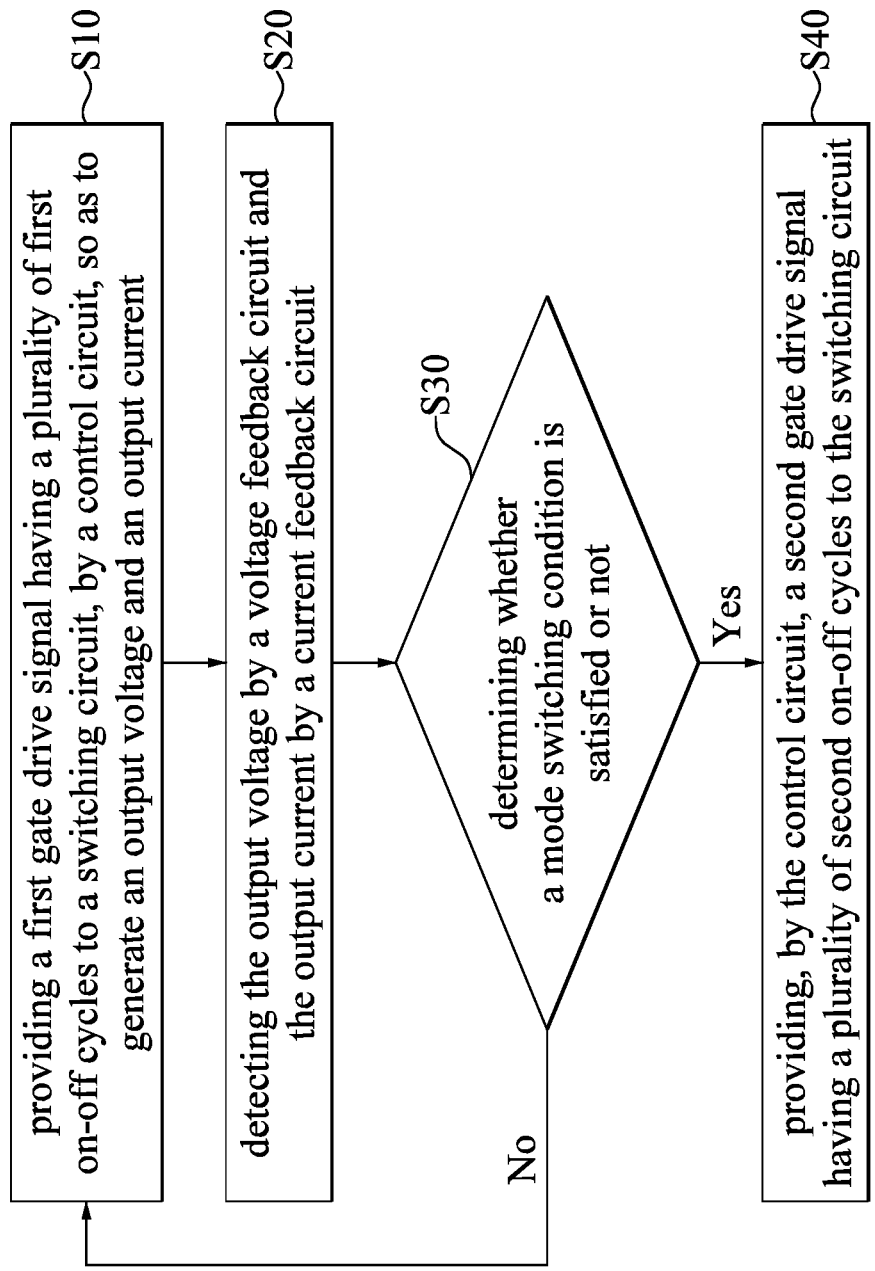
FIG. 1 is a flowchart of a soft-start method of a switching regulator according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a flowchart of a soft-start method for a switching regulator according to an embodiment of the present disclosure. The soft-start method can be executed by a switching regulator, such as a buck switching regulator or a boost switching regulator, for transforming an input voltage into a pulsed output voltage, which is then smoothed by using at least one of a capacitor, an inductor, and other elements.

Figure 2:
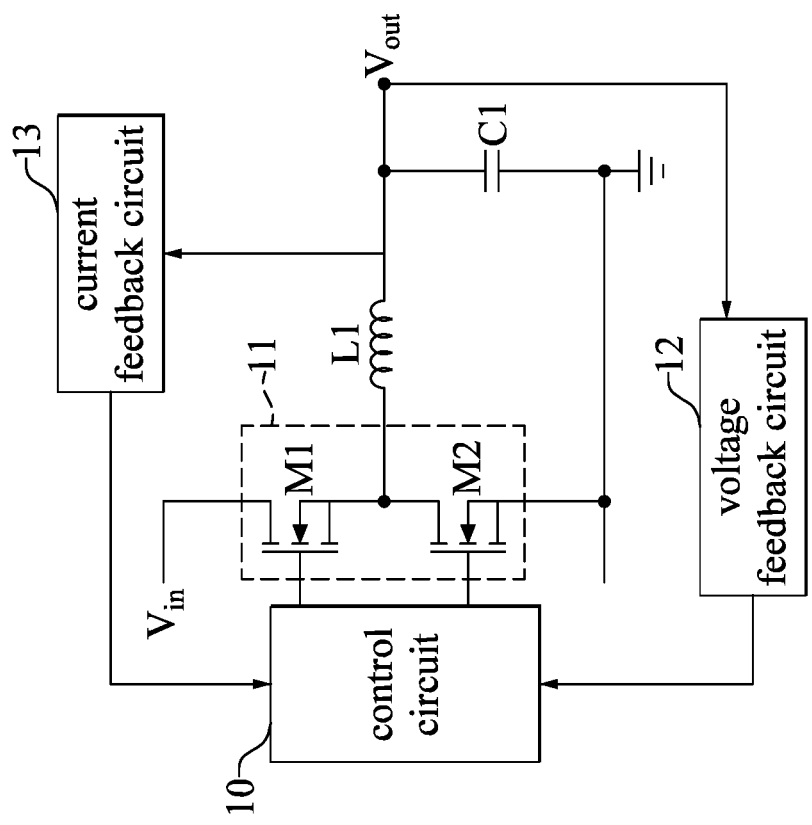
FIG. 2 is a circuit schematic diagram of a DC-to-DC buck convertor according to an embodiment of the present disclosure.

Reference is made to FIG. 2, which is to be read in conjunction with FIG. 1. FIG. 2 is a circuit schematic diagram of a switching regulator according to an embodiment of the present disclosure. The switching regulator 1 shown in FIG. 2 is a buck switching regulator, but the present disclosure is not limited thereto. As shown in FIG. 2, the switching regulator 1 may include a control circuit 10, a switching circuit 11, a voltage feedback circuit 12, a current feedback circuit 13, an inductor L1, and a capacitor C1.

The control circuit 10 is electrically coupled to the switching circuit 11 so as to provide a gate drive signal to the switching circuit 11. The switching circuit 11 of the instant embodiment includes two field-effect transistors (FETs) M1, M2 which are electrically connected to each other in a series manner, but the present disclosure is not limited thereto. In another embodiment, the switching circuit 11 may include a transistor and a diode which are electrically connected to each other.

Furthermore, the switching circuit 11 is electrically connected to the inductor L1 and the capacitor C1. The inductor L1 and the capacitor C1 are suitably designed so as to smooth the output voltage. In the instant embodiment, the inductor L1 has a predetermined inductance value.

The voltage feedback circuit 12 for detecting the output voltage is electrically connected between the control circuit 10 and one terminal of the inductor L1. The voltage feedback circuit 12 may include at least one comparator, which compares the output voltage with a reference voltage so as to determine whether the output voltage is equal to or greater than the reference voltage. When the voltage feedback circuit 12 determines that the output voltage is equal to or greater than the reference voltage, the voltage feedback circuit 12 transmits a switching signal to the control circuit 10.

After the control circuit 10 receives the switching signal transmitted by the voltage feedback circuit 12, the control circuit 10 may adjust the parameters, such as a cycle period or a duty ratio, of the gate drive signal provided to the switching circuit 11 according to the switching signal. In another embodiment, the voltage feedback circuit 12 can be integrated with the control circuit 10.

Furthermore, the current feedback circuit 13 is electrically connected between one terminal of the inductor L1 and the control circuit 10 so as to detect an output current $I_L$ flowing through the inductor L1. The current feedback circuit 13 detects the output current $I_L$ and then transmits the signal corresponding to the output current $I_L$ to the control circuit 10. Similarly, the control circuit 10 may control or adjust the gate drive signal provided to the switching circuit 11 according to the detected output current $I_L$. Moreover, an input voltage $V_{in}$ can be supplied to the switching circuit 11 by a power supply (not shown in the FIG. 2).

The switching regulator 1 shown in FIG. 2 is only exemplified to explain the soft-start method of the present disclosure, but the soft-start method of the present disclosure is not limited to being executed by the buck switching regulator, and can also be executed by another type of regulator, such as a boost switching regulator. The detailed steps of the soft-start method shown in FIG. 1 will be described in conjunction with the switching regulator shown in FIG. 2.

Further, the soft-start method of the present disclosure can be executed by the switching regulator 1 so as to limit an inrush current before the output voltage of the switching regulator 1 reaches a predetermined voltage. Furthermore, in one embodiment, a soft-start period of the switching regulator 1 can be divided into at least two stages, such as a first soft-start stage and a second soft-start stage. The switching regulator 1 may operate under different modes respectively in the first and second soft-start stages so that the soft-start period can be reduced. Meanwhile, an inrush current can be limited during the soft-start period. The detailed steps of the soft-start method are described below.

Reference is made to FIG. 1. In step S10, a first gate drive signal having a plurality of first on-off cycles is provided to a switching circuit by a control circuit so as to generate an output voltage and an output current. In step S20, the output voltage and the output current are detected by a voltage feedback circuit and a current feedback circuit, respectively.

To be more specific, as shown in FIG. 2, the control circuit 10 can provide the first gate drive signal to the switching circuit 11 so as to control the two field-effect transistors M1, M2 of the switching circuit 11 to be turned on or off. The first gate drive signal has a plurality of first on-off cycles. The switching circuit 11 may generate an output voltage $V_{out}$ and an output current $I_L$ according to the first gate drive signal and the input voltage.

In the instant embodiment, the output voltage $V_{out}$ is detected by the voltage feedback circuit 12, and the output current $I_L$ is detected by the current feedback circuit 13. The output voltage $V_{out}$ and the output current $I_L$ can be obtained by the control circuit 10 according to the signals transmitted from the voltage feedback circuit 12 and the current feedback circuit 13, respectively. As such, the output voltage $V_{out}$ can be regulated by the control circuit 10.

Figure 3:
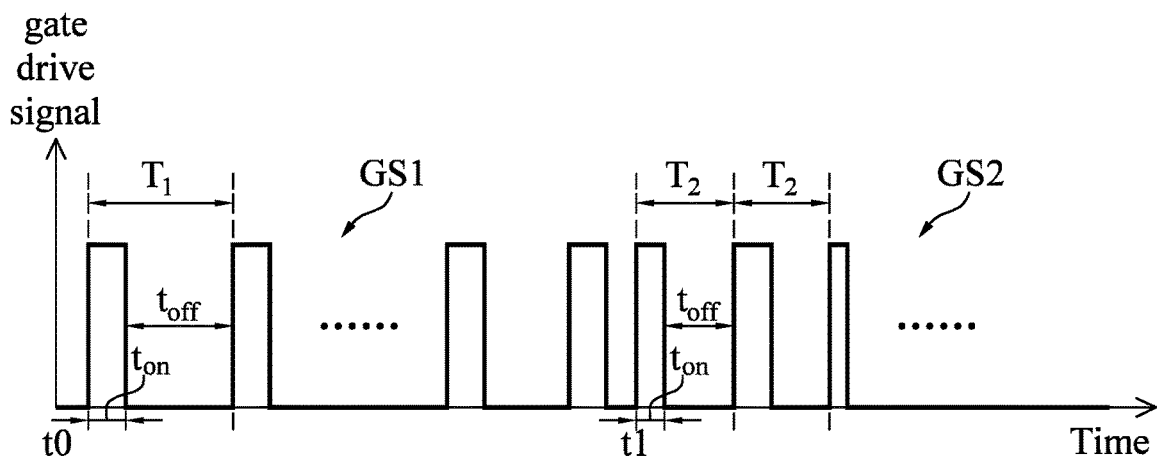
FIG. 3 is a schematic diagram showing a waveform of a gate drive signal according to an embodiment of the present disclosure.

Reference is made to FIG. 3, which is a schematic diagram showing a waveform of a gate drive signal according to an embodiment of the present disclosure. In the instant embodiment, the first gate drive signal GS1 is provided at a starting time t0, i.e., the time when the switching regulator 1 starts to work, by the control circuit 10.

As shown in FIG. 3, the first gate drive signal GS1 has a plurality of first on-off cycles, and each of the first on-off cycles has a first period $T_1$. Furthermore, each first period $T_1$ contains a switched-on period $t_{on}$ and a switched-off period $t_{off}$. That is to say, a sum of the switched-on period $t_{on}$ and the switched-off period $t_{off}$ is equal to the first period $T_1$.

The first gate drive signal GS1 is provided for limiting an inrush current and can be a pulse skip modulation (PSM) signal. In one embodiment, the pulse of the PSM signal can be generated by the control circuit 10. Specifically, the control circuit 10 determines whether the pulse of the PSM signal is skipped or not according to the signals transmitted by the voltage feedback circuit 12 and the current feedback circuit 13. However, both the frequency and width of the pulse of the PSM signal are constant.

Furthermore, in one embodiment, the input voltage $V_{in}$, a predetermined inductance value L, and the switched-on period $t_{on}$ satisfy the following relationship: $(V_{in}/L) \times t_{on} < N$ or $t_{on} < N \times (L/V_{in})$, in which L represents a predetermined inductance value, $V_{in}$ represents the input voltage, $t_{on}$ represents the switched-on period of each of the first on-off cycles, and N represents an adjustable value that ranges, for example, from 10 µA to 150 µA. That is to say, the switched-on period $t_{on}$ of each of the first on-off cycles can be preset according to the abovementioned relationship, so as to limit the inrush current.

The output current $I_L$ would linearly rise during the switched-on period $t_{on}$ of each first on-off cycle, and would linearly decrease during the switched-off period $t_{off}$ of each first on-off cycle.

Figure 4:
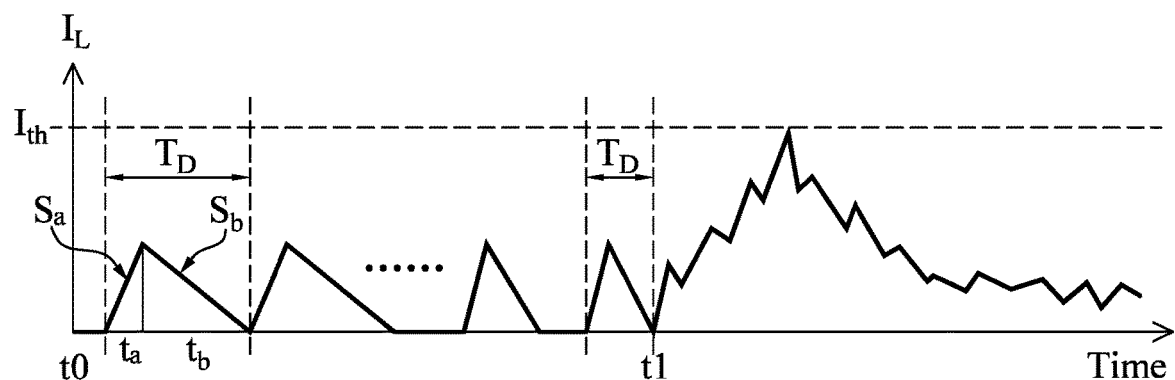
FIG. 4 is a schematic diagram showing a waveform of an output current ($I_L$) according to an embodiment of the present disclosure.

Reference is made to FIG. 4, which is a schematic diagram showing a waveform of an output current $I_L$ according to an embodiment of the present disclosure. It should be noted that the output current $I_L$ outputted by the switching circuit 11 may have a plurality of ramp up/down cycles, and the ramp up/down cycles may respectively have different durations $T_D$. In one embodiment, the durations $T_D$ of the ramp up/down cycles decrease with time during the soft-start period, i.e., from the starting time t0 to the switching time t1.

As shown in FIG. 4, in each of the ramp up/down cycles, the output current $I_L$ increases with a rising slope and then decreases with a falling slope. Furthermore, as shown in FIG. 4, in the initial ramp up/down cycle of the output current $I_L$, since the output voltage $V_{out}$ is equal to zero, the rising slope $S_a$ can be calculated by dividing the input voltage $V_{in}$ by the predetermined inductance value L. That is to say, the rising slope $S_a$ of the initial ramp up/down cycle, the input voltage Vie, and the predetermined inductance value L satisfy the following relationship: $S_a = V_{in}/L$. Furthermore, the ramp up period $t_a$ can be determined based on the switched-on period $t_{on}$ of each of the first on-off cycles.

In one embodiment, the first period $T_1$ of each of the first on-off cycles may be substantially equal to the duration $T_D$ of the initial ramp up/down cycle of the output current $I_L$.

Reference is made to FIG. 1. In step S30, whether a mode switching condition is satisfied or not is determined. Specifically, the control circuit 10 can determine whether the mode switching condition is satisfied or not according to the output voltage $V_{out}$ and the output current $I_L$ that are obtained by the control circuit.

When the control circuit 10 determines that the mode switching condition is not satisfied, the method returns to step S10 and is repeated therefrom. That is to say, before the mode switching condition is satisfied, the control circuit 10 continuously provides the first gate drive signal GS1.

When the control circuit 10 determines that the mode switching condition is satisfied, the method proceeds to step S40, in which a second gate drive signal having a plurality of second on-off cycles is provided by the control circuit to the switching circuit. Accordingly, the control circuit provides the first gate drive signal until the mode switching condition is satisfied.

Reference is made to FIG. 3 again. If the mode switching condition is satisfied at a switching time t1, the control circuit 10 starts to provide the second gate drive signal GS2 to the switching circuit 11 at the switching time t1. Accordingly, the first soft-start stage starts at the starting time t0 and then ends at the switching time t1, and the second soft-start stage starts at the switching time t1.

It should be noted that the mode switching condition can be preset according to at least one of the output current $I_L$ or the output voltage $V_{out}$. After the mode switching condition is satisfied, the possibility of generating the inrush current is sufficiently low to allow the output voltage $V_{out}$ to increase with a faster rise rate. That is to say, at the second soft-start stage, the output current $I_L$ can be controlled to not exceed beyond a preset upper limit value $I_{th}$, as shown in FIG. 4, even if the output voltage $V_{out}$ is increased with a faster rise rate. The second gate drive signal GS2 for increasing the rise rate of the output voltage $V_{out}$ can be provided to the switching circuit 11. The details of the mode switching condition will be described in the following descriptions.

Accordingly, in the soft-start method of the present disclosure, two different gate drive signals (i.e., the first and second gate drive signals GS1, GS2) are respectively provided to the switching circuit 11 by the control circuit 10 at the first and second soft-start stages.

Specifically, an inrush current can be attenuated or prevented at the first soft-start stage by providing the first gate drive signal GS1 to the switching circuit 11 until the inrush current is unable to be generated. Furthermore, by providing the second gate drive signal GS2 to the switching circuit 11 at the second soft-start stage, the output voltage $V_{out}$ can be increased to a predetermined voltage within a relatively short period. Accordingly, by executing the soft-start method of the present disclosure, a shorter rise time is required for the output voltage $V_{out}$ to reach the predetermined voltage under a situation where the inrush current is limited.

The second gate drive signal GS2 includes a plurality of second on-off cycles, as shown in FIG. 3. Each of the second on-off cycles has a second period $T_2$, which also contains a switched-on period and a switched-off period. Furthermore, a ratio of a second period $T_2$ of each second on-off cycle to a first period $T_1$ of each first on-off cycle ranges from, for example, 0.01 to 3.

In one embodiment, the first gate drive signal GS1 is a pulse skip modulation (PSM) signal, and the second gate drive signal GS2 is a pulse width modulation (PWM) signal. That is to say, the switching regulator 1 operates under a PSM mode until the mode switching condition is satisfied. In one embodiment, the frequency of the PWM signal may be about 10 times the frequency of the PSM signal.

It should be noted that the mode switching condition may include at least one requirement. In one embodiment of the present disclosure, the mode switching condition includes two requirements, in which one of the requirements is that the output voltage $V_{out}$ is greater than or equal to a threshold voltage ($V_{th}$), and another one of the requirements is that a duration $T_D$ of one of the ramp up/down cycles of the output current $I_L$ is less than a second period $T_2$ of each second on-off cycle.

That is to say, when the control circuit 10 determines that the output voltage $V_{out}$ is greater than or equal to the threshold voltage and the duration $T_D$ of one of the ramp up/down cycles is less than the second period $T_2$ of each second on-off cycle, the method proceeds to step S40.

On the contrary, when the control circuit 10 determines that the output voltage $V_{out}$ is less than the threshold voltage or the duration $T_D$ of each ramp up/down cycle of the output current $I_L$ is greater than or equal to the second period $T_2$ of each second on-off cycle, the control circuit 10 continuously provides the first gate drive signal GS1 to the switching circuit 11.

It should be noted that the threshold voltage can be preset according to a required upper limit value of an inrush current. Specifically, the lower the required upper limit value of the inrush current, the lower the preset threshold voltage.

In another embodiment, the soft-start method further includes a step of calculating a parameter value by dividing the output voltage $V_{out}$ by the predetermined inductance value L. That is to say, the parameter value, the output voltage $V_{out}$, and the predetermined inductance value L satisfy the following relationship: $V_{out}/L=M$, in which $V_{out}$ represents the output voltage detected by the voltage feedback circuit 12, L represents a predetermined inductance value, and M represents the parameter value.

In this embodiment, the mode switching condition may include the parameter value (M) being greater than or equal to a threshold value, and the duration $T_D$ of each ramp up/down cycle being less than the second period $T_2$ of each second on-off cycle. That is to say, when the control circuit 10 determines that the parameter value (M) is greater than or equal to a threshold value and the duration $T_D$ of each ramp up/down cycle is less than the second period $T_2$ of each second on-off cycle, the method proceeds to the step S40.

On the contrary, if either the parameter value (M) is less than the threshold value or the duration $T_D$ of each ramp up/down cycle is greater than or equal to the second period $T_2$ of each second on-off cycle, the control circuit 10 will continuously provide the first gate drive signal to the switching circuit 11. As mentioned above, after the mode switching condition is satisfied, the possibility of generating the inrush current would be reduced. Accordingly, the second gate drive signal GS2 for increasing the rise rate of the output voltage $V_{out}$ can be provided to the switching circuit 11, such that the output voltage $V_{out}$ reaches a predetermined voltage within a relatively shorter rise time.

Figure 5:
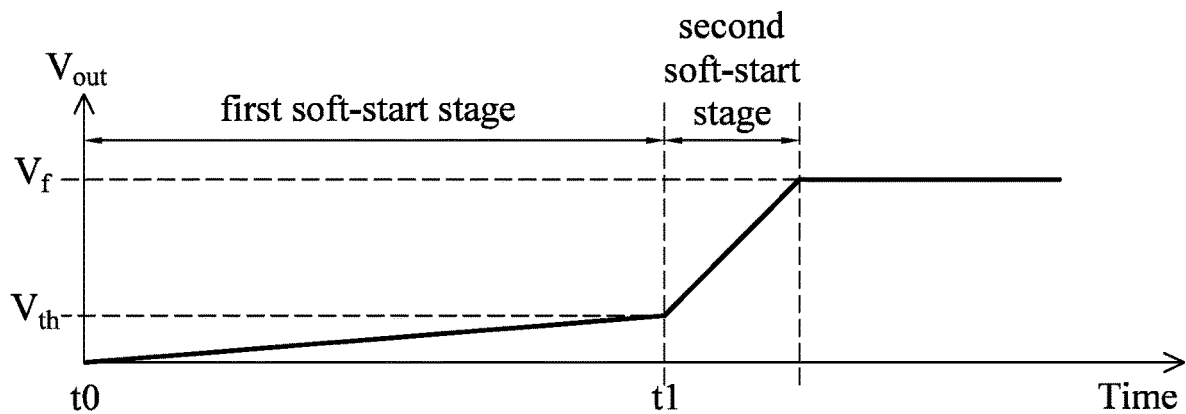
FIG. 5 is a schematic diagram showing a relationship between an output voltage ($V_{out}$) and time according to an embodiment of the present disclosure.

Reference is made to FIG. 5, which is a schematic diagram showing a relationship between time and the output voltage according to an embodiment of the present disclosure. It should be noted that the output voltage $V_{out}$ increases by providing the first gate drive signal GS1 to the switching circuit 11, and then reaches a threshold voltage $V_{th}$ at the switching time t1, which is the time when the mode switching condition is satisfied. After the switching time t1, the second gate drive signal GS2 is provided to the switching circuit 11 by the control circuit 10, such that the output voltage $V_{out}$ increases with time until the output voltage Vout reaches the predetermined voltage $V_f$.

As shown in FIG. 5, by using the abovementioned soft-start method, the output voltage ($V_{out}$) increases with different slopes respectively in different soft-start stages before the output voltage reaches the predetermined voltage ($V_f$).

Specifically, as shown in FIG. 3 and FIG. 5, since the first gate drive signal GS1 is provided from the starting time t0 to the switching time t1, the output voltage $V_{out}$ gradually increases with time in the first soft-start stage (i.e., from the starting time t0 to the switching time t1). Furthermore, by providing the second gate drive signal GS2 to the switching circuit 11, the output voltage $V_{out}$ sharply increases with time until the output voltage $V_{out}$ reaches the predetermined voltage $V_f$. That is to say, the output voltage $V_{out}$ increases with a faster rise rate in the second soft-start stage. Accordingly, the rise rate (or the slope) of the output voltage $V_{out}$ at the second soft-start stage is greater than that at the first soft-start stage.

However, even though the output voltage $V_{out}$ reaches the predetermined voltage $V_f$, the control circuit 10 still provides the second gate drive signal GS2 to the switching circuit 11. As mentioned above, the second gate drive signal GS2 may be a PWM signal. Accordingly, after the mode switching condition is satisfied, the switching regulator 1 continuously operates under the PWM mode.

In conclusion, one of the advantages of the present disclosure is that in a soft-start method for a switching regulator, by providing the first gate drive signal GS1 having a plurality of first on-off cycles to the switching circuit 11 at the first soft-start stage and providing the second gate drive signal GS2 having a plurality of second on-off cycles to the switching circuit 11 at the second soft-start stage, the output current $I_L$ can be limited to being within a tolerance range during startup of the switching regulator 1. In addition, the output voltage $V_{out}$ can be increased to a predetermined voltage $V_f$ within a relatively shorter rise time.

Specifically, in the soft-start method of the present disclosure, the first gate drive signal GS1 is provided in the first soft-start stage for limiting or preventing the inrush current, and the second gate drive signal GS2 for increasing the rise rate of the output voltage $V_{out}$ is provided in a second soft-start stage.

In one embodiment, the switching regulator 1 operates under the PSM mode at the first soft-start stage, and then operates under the PWM mode at the second soft-start stage. Since the possibility of generating an inrush current is relatively low at the second soft-start stage, the output voltage $V_{out}$ can rapidly rise at the second soft-start stage by providing the PWM signal (or the second gate drive signal GS2) to the switching circuit 11 after the mode switching condition is satisfied. As such, compared with a conventional soft-start method, by executing the soft-start method of the present disclosure, the overall rise time (including the durations of the first and second soft-start stages) of the output voltage $V_{out}$ can be reduced. Meanwhile, the inrush current can also be easily limited or prevented.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A soft-start method for a switching regulator, comprising:
   providing a first gate drive signal having a plurality of first on-off cycles to a switching circuit, by a control circuit, so as to generate an output voltage and an output current;
   detecting the output voltage by a voltage feedback circuit and the output current by a current feedback circuit;
   determining whether or not a mode switching condition is satisfied or not according to the output voltage and the output current that are obtained by the control circuit; and
   when the mode switching condition is satisfied, providing a second gate drive signal having a plurality of second on-off cycles to the switching circuit, by the control circuit, so that the output voltage is increased to a predetermined voltage,
   wherein the output current has a plurality of ramp up/down cycles, and the mode switching condition includes the output voltage being greater than or equal to a threshold voltage, and a duration of each ramp up/down cycle being less than a second period of each second on-off cycle.

2. The soft-start method according to claim 1, further comprising:
   when the mode switching condition is not satisfied, still providing the first gate drive signal to the switching circuit by the control circuit.

3. The soft-start method according to claim 1, wherein the first gate drive signal is a pulse skip modulation (PSM) signal, and the second gate drive signal is a pulse width modulation (PWM) signal.

4. The soft-start method according to claim 1, comprising:
   providing an input voltage to the switching circuit by a power supply, wherein the first gate drive signal has a switched-on period in each first on-off cycle, and the input voltage, the output voltage, and the switched-on period satisfy the following relationship:

$(V_{in}/L) \times t_{on} < N;$ wherein L represents a predetermined inductance value, $V_{in}$ represents the input voltage, $t_{on}$ represents the switched-on period, and N represents an adjustable value that ranges from 10 µA to 150 µA.

5. The soft-start method according to claim 1, wherein a ratio of the second period of each second on-off cycle to a first period of each first on-off cycle ranges from 0.01 to 3.

6. The soft-start method according to claim 1, wherein the switching regulator is a buck switching regulator or a boost switching regulator.

7. The soft-start method according to claim 1, further comprising:
   calculating a parameter value by dividing the output voltage by a predetermined inductance value, wherein the mode switching condition further includes the parameter value being greater than or equal to a threshold value.

8. The soft-start method according to claim 1, wherein the first gate drive signal is provided at a starting time, the second gate drive signal is provided at a switching time, the output voltage gradually increases with time in a time period from the starting time to the switching time, and the output voltage sharply increases with time after the switching time until the output voltage reaches the predetermined voltage.

9. A soft-start method for a switching regulator, comprising:
   providing a pulse skip modulation (PSM) signal having a plurality of first on-off cycles to a switching circuit at a first soft-start stage, by a control circuit, so as to generate an output voltage and an output current;
   determining whether a switching mode condition is satisfied or not according to the output voltage and the output current; and
   when the switching mode condition is satisfied, providing a pulse width modulation (PWM) signal having a plurality of second on-off cycles to the switching circuit at a second soft-start stage so that the output voltage is increased to a predetermined voltage, wherein the first soft-start stage is prior to the second soft-start stage.

10. The soft-start method according to claim 9, wherein the output current has a plurality of ramp up/down cycles, and the switching mode condition includes the output voltage being greater than or equal to a threshold voltage, and a duration of each ramp up/down cycle being less than a period of each second on-off cycle.

11. The soft-start method according to claim 9, further comprising:
calculating a parameter value by dividing the output voltage by a predetermined inductance value, wherein the mode switching condition includes the parameter value being greater than or equal to a threshold value, and a duration of each ramp up/down cycle of the output current being less than a period of each second on-off cycle.

12. The soft-start method according to claim 9, wherein the output voltage gradually increases with time at the first soft-start stage, and then sharply increases with time at the second soft-start stage until the output voltage reaches the predetermined voltage.

13. The soft-start method according to claim 9, comprising:
providing an input voltage to the switching circuit by the control circuit, wherein the PSM signal has a switched-on period in each first on-off cycle, and the input voltage, the output voltage, and the switched-on period satisfy the following relationship:

$$(V_{in}/L) \times t_{on} < N;$$

wherein L represents a predetermined inductance value, $V_{in}$ represents the input voltage, $t_{on}$ represents the switched-on period, and N represents an adjustable value and ranges from 10 µA to 150 µA.

14. The soft-start method according to claim 9, wherein a ratio of a first period of each first on-off cycle to a second period of each second on-off cycle ranges from 0.01 to 3.

15. A soft-start method for a switching regulator, comprising:
providing a first gate drive signal having a plurality of first on-off cycles to a switching circuit, by a control circuit, so as to generate an output voltage and an output current;
detecting the output voltage by a voltage feedback circuit and the output current by a current feedback circuit;
determining whether or not a mode switching condition is satisfied or not according to the output voltage and the output current that are obtained by the control circuit; and
when the mode switching condition is satisfied, providing a second gate drive signal having a plurality of second on-off cycles to the switching circuit, by the control circuit, so that the output voltage is increased to a predetermined voltage,
wherein the output current has a plurality of ramp up/down cycles, and the mode switching condition is based on a duration of each ramp up/down cycle of the output current,
wherein the mode switching condition is further based on a second period of each second on-off cycle,
wherein the mode switching condition includes the duration of each ramp up/down cycle being less than the second period of each second on-off cycle.

* * * * *